United States Patent
Peng et al.

(10) Patent No.: US 10,904,139 B2
(45) Date of Patent: Jan. 26, 2021

(54) DATA TRANSMISSION METHOD AND APPARATUS AND NETWORK ELEMENT

(71) Applicant: Huawei Technologies Co., Ltd., Shenzhen (CN)

(72) Inventors: Xiaopeng Peng, Shenzhen (CN); Hewen Zheng, Nanjing (CN); Haotao Pan, Nanjing (CN); Li Shen, Nanjing (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 43 days.

(21) Appl. No.: 16/225,385

(22) Filed: Dec. 19, 2018

(65) Prior Publication Data
US 2019/0123997 A1  Apr. 25, 2019

Related U.S. Application Data

(63) Continuation of application No. PCT/CN2017/076966, filed on Mar. 16, 2017.

(30) Foreign Application Priority Data

Jun. 22, 2016  (CN) .......................... 2016 1 0459884

(51) Int. Cl.
*G06F 15/173*  (2006.01)
*H04L 12/703*  (2013.01)
(Continued)

(52) U.S. Cl.
CPC .......... *H04L 45/28* (2013.01); *G06F 11/1004* (2013.01); *H04L 1/0061* (2013.01);
(Continued)

(58) Field of Classification Search
CPC ......... H04L 45/28; H04L 45/24; H04L 45/02; H04L 45/16; H04L 45/7453; H04L 45/22;
(Continued)

(56) References Cited

U.S. PATENT DOCUMENTS

2009/0067324 A1*  3/2009  Licardie ................ H04L 47/125
                                                                  370/225
2012/0087372 A1   4/2012  Narasimhan
(Continued)

FOREIGN PATENT DOCUMENTS

CN   102098740 A   6/2011
CN   102263697 A   11/2011
(Continued)

OTHER PUBLICATIONS

Cheney Shue, "Cyclic Redundancy Check (CRC) algorithm principle," Aug. 9, 2007, retrieved from http://www.cnblogs.com/esestt/archive/2007/08/09/848856.html, 26 pages.
(Continued)

*Primary Examiner* — Richard G Keehn
(74) *Attorney, Agent, or Firm* — Slater Matsil, LLP

(57) ABSTRACT

A method for data transmission includes receiving a packet, determining a first member link in a first group of member links based on a first decision manner. If the first member link is unavailable, the method includes determining a second member link in a second group of member links based on a second decision manner, where all member links in the second group of member links are available and the first group of member links includes the second group of member links and an unavailable member link. The method includes sending the packet through the second member link.

15 Claims, 3 Drawing Sheets

(51) Int. Cl.
  *H04L 12/803* (2013.01)
  *H04L 1/00* (2006.01)
  *H04L 12/24* (2006.01)
  *G06F 11/10* (2006.01)
  *H04L 12/26* (2006.01)
  *H04L 12/891* (2013.01)
  *H04L 12/707* (2013.01)
  *H04L 12/751* (2013.01)
  *H04L 12/761* (2013.01)
  *H04L 12/743* (2013.01)
  *H04L 12/851* (2013.01)
  *H03M 13/09* (2006.01)

(52) U.S. Cl.
  CPC ...... *H04L 41/0668* (2013.01); *H04L 43/0823* (2013.01); *H04L 45/02* (2013.01); *H04L 45/16* (2013.01); *H04L 45/22* (2013.01); *H04L 45/24* (2013.01); *H04L 45/7453* (2013.01); *H04L 47/125* (2013.01); *H04L 47/2483* (2013.01); *H04L 47/41* (2013.01); *H03M 13/09* (2013.01)

(58) Field of Classification Search
  CPC ............... H04L 1/0061; H04L 41/0668; H04L 41/0823; H04L 43/0823; H04L 47/41; H04L 47/2483; H04L 47/125; G06F 11/1004; H03M 13/09
  See application file for complete search history.

(56) References Cited

U.S. PATENT DOCUMENTS

| | | | |
|---|---|---|---|
| 2012/0230194 A1* | 9/2012 | Matthews | ............ H04L 47/125 370/235 |
| 2013/0003549 A1 | 1/2013 | Matthews et al. | |
| 2014/0198656 A1 | 7/2014 | Venkatesh et al. | |

FOREIGN PATENT DOCUMENTS

| | | |
|---|---|---|
| CN | 102577280 A | 7/2012 |
| CN | 102685007 A | 9/2012 |
| CN | 102857419 A | 1/2013 |
| CN | 103236975 A | 8/2013 |
| CN | 103401801 A | 11/2013 |
| EP | 2661048 B1 | 3/2016 |
| WO | 2013017017 A1 | 2/2013 |

OTHER PUBLICATIONS

Jo, Ju-Yeon et al., "Internet Traffic Load Balancing using Dynamic Hashing with Flow Volume," Proceedings vol. 4865, Internet Performance and Control of Network Systems III, 2002, 12 pages.
Information Sciences Institute, "Internet Protocol, DARPA Internet Program, Protocol Specification," RFC 791, Sep. 1981, 49 pages.
Information Sciences Institute, "Transmission Control Protocol, DARPA Internet Program, Protocol Specification," RFC 793, Sep. 1981, 89 pages.
Wikipedia, "Cyclic redundancy check," Retrieved from https://en.wikipedia.org/wiki/Cyclic_redundancy_check, Dec. 27, 2018, 9 pages.

* cited by examiner

```
g₀   101001110100001 00000000
h        111010101
g₁   010011011 10000100000000
h        111010101
g₂   011100010000100000000
h        111010101
g₃   000010001000100000000
h        111010101
g₄     0110001 0000000000
h        111010101
g₅     001011 1010000000
h        111010101
g₆      010100001 00000
h        111010101
g₇      0100101 110000
h        111010101
g₈       011111011000
h        111010101
r        000010001100
```

DATA TRANSMISSION METHOD AND APPARATUS AND NETWORK ELEMENT

CROSS-REFERENCE TO RELATED APPLICATIONS

This application is a continuation of International Application No. PCT/CN2017/076966, filed on Mar. 16, 2017, which claims priority to Chinese Patent Application No. 201610459884.6, filed on Jun. 22, 2016. The disclosures of the aforementioned applications are hereby incorporated by reference in their entireties.

TECHNICAL FIELD

The present invention relates to the field of communications technologies, and in particular, to a data transmission method and apparatus and a network element.

BACKGROUND

At present, network elements are interconnected in a mode of connecting optical fibers through an optical module. A price difference between optical modules of different rates is relatively large. For example, a price of a 10-gigabit small form-factor pluggable transceiver (SFP for short) is only 3.8% of a price of a 40-gigabit SFP. Because of a price difference between optical modules, usually a plurality of low-speed links may be selected for connecting two network elements. Therefore, in an existing network, a plurality of links is widely deployed, and accordingly, multi-link load-balancing requirements and technologies arise.

In the prior art, a network element uses the following load-balancing technology. After receiving a packet, the network element extracts a source address and a destination address from a packet header. The packet is, for example, an Internet Protocol (IP for short) packet, and a source IP address and a destination IP address are extracted from an IP packet header. Further, a source port number and a destination port number may be further extracted from a transport layer protocol header. A transport layer protocol is, for example, the Transmission Control Protocol (TCP for short) or the User Datagram Protocol (UDP for short). Next, the network element constructs the extracted source address, destination address, transport layer source port, and transport layer destination port into a bit sequence. The bit sequence is used to describe a data flow in which the packet is located and also is used as an input parameter of a load-balancing algorithm. Specifically, a cyclic redundancy check (CRC for short) algorithm is used to calculate a hash (Hash) value of the bit sequence, and a modulo operation is performed on a quantity of all available egress ports of the network element based on the hash value that is obtained through calculation, so as to map the packet to a determined physical port and select the physical port as an egress port for forwarding the packet.

In the foregoing load-balancing technology, a last step is performing a modulo operation on a quantity of egress ports of available links based on the hash value, and then a determined value is obtained as a final egress port. In other words, a failed link or a link that is no longer in use due to a management reason is not considered for the quantity of egress ports. This design ensures that the finally chosen egress port is always an available port. However, the following technical problem arises: If a link fails, a packet flow on another properly-functioning link before the link fails is redistributed. For example, according to the foregoing load-balancing technology, a packet flow 2 and a packet flow 7 are directed to a link 1, and a packet flow 1, a packet flow 3, and a packet flow 6 are directed to a link 4. The link 4 suddenly fails. In this case, the packet flow 2 is directed to a link 3, but not to the originally directed-to link 1. Only the packet flow 7 is distributed on the link 1. In comparison with packet flows before the link 4 fails, packet flows distributed on the link 1 and the link 3 change.

SUMMARY

Embodiments of the present invention provide a data transmission method and apparatus and a network element, to resolve the following prior-art technical problem caused due to consideration of only available links during load-balancing: When a link fails, a packet flow on another properly-functioning link before the link fails is redistributed.

According to a first aspect, an embodiment of the present invention provides a data transmission method, including: receiving a packet; determining a first member link in a first group of member links based on a first decision manner, and if the first member link is unavailable, determining a second member link in a second group of member links based on a second decision manner, where all member links in the second group of member links are available and the first group of member links includes the second group of member links and an unavailable member link; and sending the packet through the second member link.

In the solution in this embodiment of the present invention, the unavailable member link is considered during a first decision, and when a result of the first decision is that the first member link is unavailable, the available second member link is determined in the second group of member links that includes only available links. Therefore, it may be ensured that the packet can be forwarded; in addition, even if a member link fails, a flow on another properly-functioning link before the member link fails is not redistributed.

With reference to the first aspect, in a first possible implementation of the first aspect, the determining a first member link in a first group of member links based on a first decision manner includes: obtaining flow information of the packet, where the flow information is used to describe the packet; performing hash calculation on the flow information; and determining the first member link in the first group of member links based on a hash value that is obtained through calculation. According to the method, it may be ensured that when a link is properly functioning, packet flows with same flow information are allocated to a same link for forwarding, thereby avoiding a packet loss and impact on session consistency.

With reference to the first possible implementation of the first aspect, in a second possible implementation of the first aspect, the performing hash calculation on the flow information includes: performing hash calculation on the flow information based on a first cyclic redundancy check CRC algorithm.

With reference to the second possible implementation of the first aspect, in a third possible implementation of the first aspect, the determining a second member link in a second group of member links based on a second decision manner includes: obtaining the flow information; performing hash calculation on the flow information based on a second CRC algorithm that is different from the first CRC algorithm; and determining the second member link in the second group of member links based on a hash value that is obtained through calculation based on the second CRC algorithm. Based on different CRC algorithms during two decisions, an unbalanced load phenomenon such as polarization can be avoided.

With reference to the first possible implementation of the first aspect, in a fourth possible implementation of the first aspect, the determining the first member link in the first group of member links based on a hash value that is obtained through calculation includes: determining the first member link based on the hash value that is obtained through calculation and a total quantity of links in the first group of member links.

According to a second aspect, an embodiment of the present invention provides a network element, including: a receiver; a port; a processor, configured to receive a packet through the receiver or generate a packet and further configured to: determine a first member link in a first group of member links based on a first decision manner, and if the first member link is unavailable, determine a second member link in a second group of member links based on a second decision manner, where all member links in the second group of member links are available, the first group of member links includes the second group of member links and an unavailable member link, and the member link corresponds to the port; and a transmitter, configured to send the packet through a port corresponding to the second member link.

With reference to the second aspect, in a first possible implementation of the second aspect, the processor is configured to: obtain flow information of the packet, where the flow information is used to describe the packet; perform hash calculation on the flow information; and determine the first member link in the first group of member links based on a hash value that is obtained through calculation.

With reference to the first possible implementation of the second aspect, in a second possible implementation of the second aspect, the processor is configured to perform hash calculation on the flow information based on a first cyclic redundancy check CRC algorithm.

With reference to the second possible implementation of the second aspect, in a third possible implementation of the second aspect, the processor is configured to: obtain the flow information, perform hash calculation on the flow information based on a second CRC algorithm that is different from the first CRC algorithm, and determine the second member link in the second group of member links based on a hash value that is obtained through calculation based on the second CRC algorithm.

With reference to the first possible implementation of the second aspect, in a fourth possible implementation of the second aspect, the processor is configured to determine the first member link based on the hash value that is obtained through calculation and a total quantity of links in the first group of member links.

According to a third aspect, an embodiment of the present invention provides a data transmission apparatus, where the data transmission apparatus includes function modules that are configured to implement the method according to the first aspect.

According to a fourth aspect, an embodiment of the present invention further provides a computer storage medium, where the computer storage medium stores program code and the program code includes an instruction for implementing any possible implementation of the method according to the first aspect.

In some possible implementations described above, the flow information includes a source Internet Protocol IP address, a destination IP address, a source port, and a destination port of the packet.

In some possible implementations described above, that a member link is available means that the member link is available both physically and in management. "Available physically" includes that a physical status of the link is normal and the link can be used to transmit data, and "available in management" includes that an administrator configures enabling of the link for participating in operating.

DETAILED DESCRIPTION OF ILLUSTRATIVE EMBODIMENTS

Embodiments of the present invention provide a data transmission method and apparatus and a network element, to resolve the following prior-art technical problem caused due to consideration of only available links during load-balancing: When a link fails, a packet flow on another properly-functioning link before the link fails is redistributed.

The following describes, in detail, implementation processes and objectives of the solutions in the embodiments of the present invention.

Figure 1A:
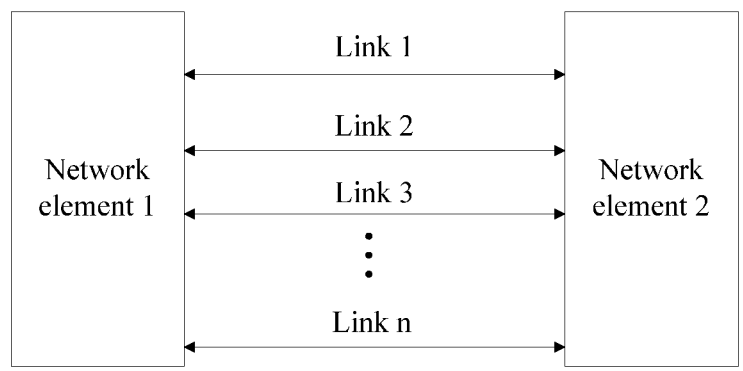
FIG. 1a and FIG. 1b are structural diagrams of a communications system according to an embodiment of the present invention.
Figure 1B:
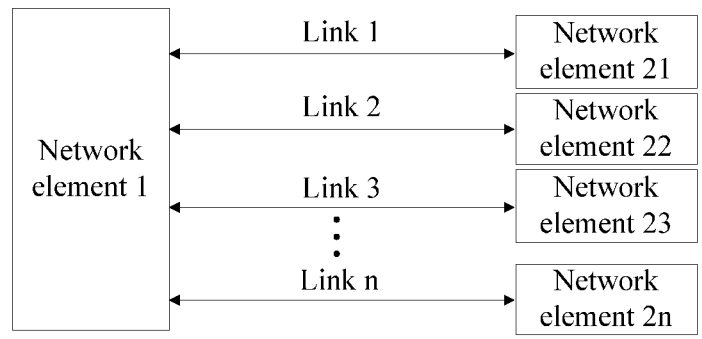

An embodiment of the present invention provides a data transmission method, and the method may be applied to a communications network system. Referring to FIG. 1a and FIG. 1b, FIG. 1a and FIG. 1b are structural diagrams of a possible communications network system according to an embodiment of the present invention. As shown by a structure in FIG. 1a, the communications network system includes a network element 1 and a network element 2. There are n transmission paths from a link 1 to a link n between the network element 1 and the network element 2, and n is an integer greater than 1. Transmission bandwidth or transmission rates of all links may be the same, or may be different. These n links are formed, for example, by connecting optical fibers through optical modules, and certainly may be links in another form. Further, in the structure shown in FIG. 1a, the network element 1 sends a received packet to the network element 2 through one of the n links, and the network element 2 performs further processing. Therefore, load balancing is needed among the n links so that load of the n links is balanced.

Optionally, the network element 1 is, for example, a server, and the network element 2 is, for example, a top-of-rack (TOR for short) switch. The n links are a link aggregation group (LGA for short).

Optionally, the network element 1 is a spine (Spine) switch, and the network element 2 is, for example, a TOR switch. The n links are equal-cost multi-path (ECMP for short).

In a structure shown in FIG. 1b, a difference from the structure shown in FIG. 1a is that one end of the n links is connected to the network element 1 and the other end is connected to different network elements, for example, a network element 21 to a network element 2n. Functions of any two network elements from the network element 21 to the network element 2n are the same or different. In this case, load balancing among the n links may also be understood as load balancing among the n network elements so that load of the n network elements is balanced.

It should be understood that the communications system shown in FIG. 1a and FIG. 1b shows only cases of two types of network elements and links; however, the present invention is not limited thereto. The communications system may further include a network-side device or a user-side device in addition to the network elements and links shown in the figures. This is not limited in this embodiment of the present invention.

In addition, the term "and/or" in this specification describes only an association relationship for describing associated objects and represents that three relationships may exist. For example, A and/or B may represent the following three cases: Only A exists, both A and B exist, and only B exists. In addition, the character "/" in this specification generally indicates an "or" relationship between the associated objects.

Figure 2:
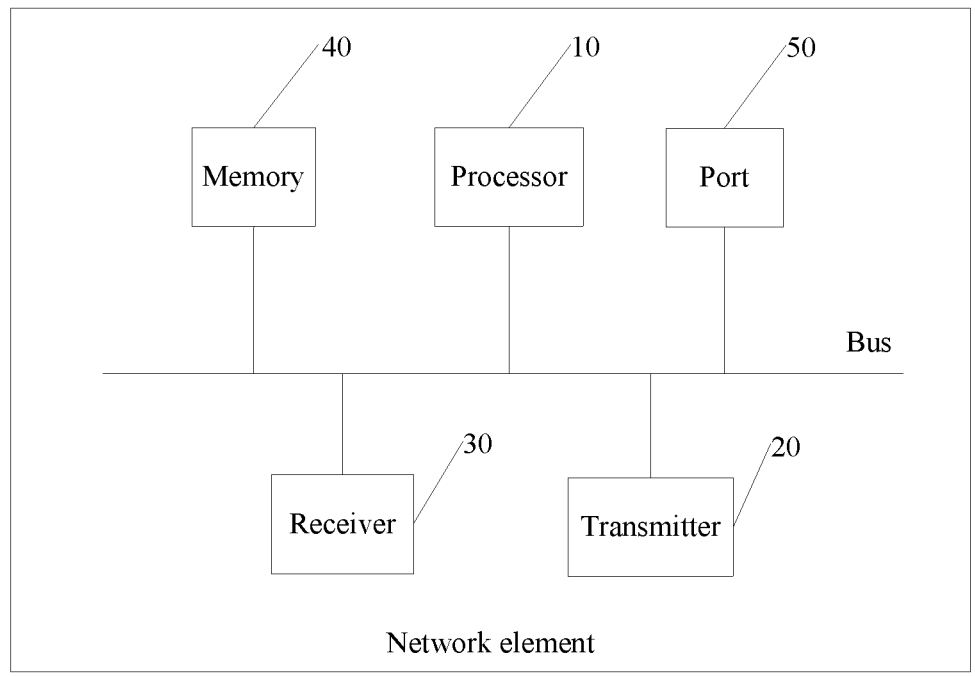
FIG. 2 is a structural diagram of a network element according to an embodiment of the present invention.

Next, referring to FIG. 2, FIG. 2 is a possible structural diagram of a network element according to an embodiment of the present invention. The network element is, for example, the foregoing network element 1, network element 2, and network element 21 to network element 2n. As shown in FIG. 2, the network element includes: a processor 10, a transmitter 20, a receiver 30, a memory 40, and a port 50. The memory 40, the transmitter 20, and the receiver 30 may be connected to the processor 10 through a bus. Certainly, in actual application, there may be not a bus structure but another structure such as a star structure between the processor 10, and the memory 40, the transmitter 20 and the receiver 30. This is not specifically limited in this application.

Optionally, the processor 10 may be specifically a general-purpose central processing unit or an application-specific integrated circuit (ASIC for short), may be one or more integrated circuits configured to control program execution, may be a hardware circuit developed by using a field programmable gate array (FPGA for short), or may be a baseband processor.

Optionally, the processor 10 may include at least one processing core.

Optionally, the memory 40 may include one or more of a read-only memory (ROM for short), a random access memory (RAM for short), and a magnetic disk memory. The memory 40 is configured to store data and/or an instruction required when the processor 10 runs. There may be one or more memories 40.

Optionally, the port 50 includes at least one input port and at least two egress ports.

Optionally, the transmitter 20 and the receiver 30 may be physically independent or integrated. The transmitter 20 may send data through an egress port of the port 50. The receiver 30 may receive data through the input port of the port 50.

Optionally, each egress port corresponds to one link.

Figure 3:
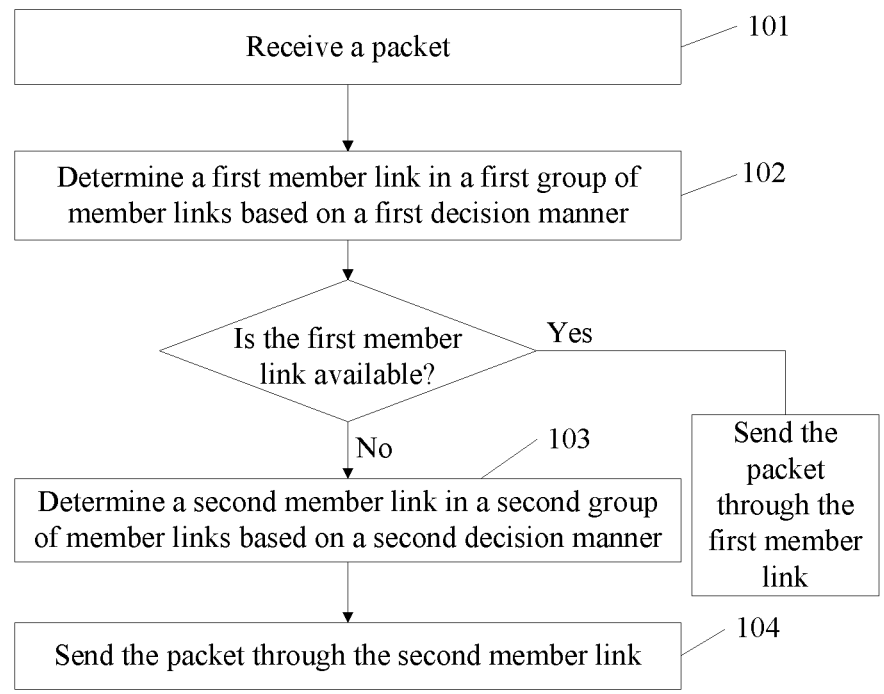
FIG. 3 is a flowchart of a data transmission method according to an embodiment of the present invention.

Next, referring to FIG. 3, FIG. 3 is a flowchart of a data transmission method according to an embodiment of the present invention. As shown in FIG. 3, the method includes the following steps:

Step 101: Receive a packet.

Step 102: Determine a first member link in a first group of member links based on a first decision manner.

Step 103: If the first member link is unavailable, determine a second member link in a second group of member links based on a second decision manner, where all member links in the second group of member links are available and the first group of member links includes the second group of member links and an unavailable member link.

Step 104: Send the packet through the second member link.

Optionally, in step 101, a network element 1 receives, through an input port 50, a packet that is sent by another network element.

Optionally, in step 101, the packet may alternatively be a packet that is generated by the network element 1.

Next, step 102 is performed, in other words, the first member link is determined in the first group of member links based on the first decision manner. The first decision manner may have a plurality of implementations, and the following gives examples for description.

In a possible implementation, step 102 includes: obtaining flow information of the packet; performing hash calculation on the flow information; and determining the first member link based on a hash value that is obtained through calculation. The flow information of the packet is used to describe the packet.

Optionally, in an IP packet, the flow information is, for example, a source IP address and a destination IP address. Further, the flow information may include a source port and a destination port. Therefore, after the packet is obtained in step 101, the packet may be parsed. A source IP address, a destination IP address, a source port, and a destination port are extracted from an IP header of the packet to form the flow information, which is, for example, a 96-bit bit sequence.

Certainly, in actual application, the flow information may alternatively be other information, provided that all packets of a packet flow can be directed to a same member link based on the flow information.

Next, hash calculation is performed on the flow information. In actual application, a plurality of hash algorithms may be used for calculation. In this embodiment of the present invention, a CRC algorithm is used as an example for description.

It is assumed that the obtained flow information is 15-bit binary information g=101001110100001. This string of binary code may be expressed as an algebraic polynomial $g(x)=x^{14}+x^{12}+x^9+x^8+x^7+x^5+1$, where a value of a $k^{th}$ bit in g corresponds to a coefficient of $x^k$ in $g(x)$. $g(x)$ is multiplied by $x^m$, to be specific, g is suffixed with m zeros, and then $g(x)$ multiplied by $x^m$ is divided by an $m^{th}$-order generator polynomial $h(x)$, to obtain an $(m-1)^{th}$-order remainder $r(x)$. A binary code r corresponding to the $(m-1)^{th}$-order remainder $r(x)$ is a CRC result. A division operation of $g(x)/h(x)$ is performing an XOR operation, that is, an exclusive OR operation, on g and h. For example, a result that is obtained through an XOR operation on 11001 and 10101 is 01100.

Figures 4, 5:
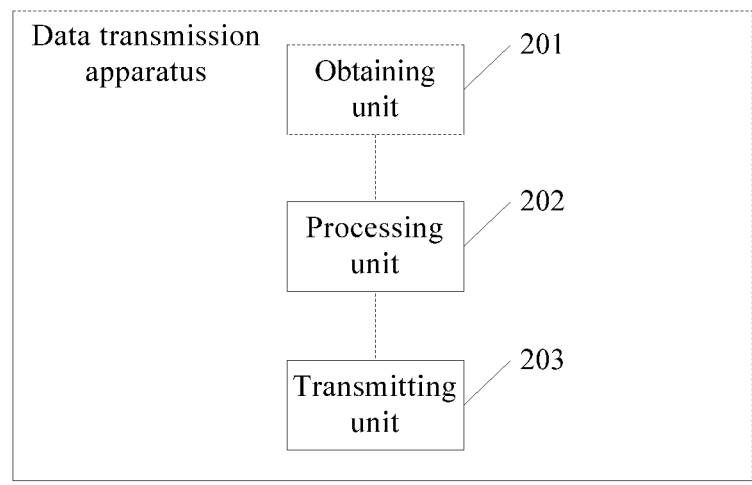
FIG. 4 is a schematic diagram of performing hash calculation based on a CRC algorithm according to an embodiment of the present invention.
FIG. 5 is a function block diagram of a data transmission apparatus according to an embodiment of the present invention.

An example in which a CRC result of binary 101001110100001 is calculated through a CRC-m(8) algorithm is used below. CRC-8 uses a standard generator polynomial $h(x)=x^8+x^7+x^6+x^4+x^2+1$, in other words, h is a 9-bit binary string 111010101. As shown in FIG. 4, g is first suffixed with m zeros, which are eight zeros in this example, to obtain 10100111010000100000000 (denoted as $g_0$ below); then a division operation is performed on $g_0$ and h, to obtain $g_1$, which is 10011111110000100000000. A division operation is further performed on $g_1$ and h, to obtain $g_2$, which is 111000001000001000000. Such an iterative operation is continued until a seventh-order remainder r is obtained, that is, 10001100, which is a CRC calculation result and also an obtained hash value, is obtained.

Then, the first member link is determined based on the hash value that is obtained through calculation and a quantity of links in the first group of member links. For example, assuming that the quantity of links in the first group of member links is 7, r modulo 7 is calculated. To be specific, a remainder is calculated by dividing the CRC result by 7. Binary 10001100 modulo 7 is calculated to obtain 0, and it indicates that the determined first member link is a first link, which may correspond to a number 0 port of the port 50.

After the hash value is obtained, another possible implementation is determining an egress port by querying a table. Specifically, a table of a correspondence between a hash value and an egress port or a link is preconfigured on a network element. The correspondence table may alternatively be determined by performing a modulo operation on a quantity of links based on a hash value. Therefore, after the hash value is obtained through calculation, a corresponding egress port or link may be determined by querying the correspondence table.

It should be noted that h(x) may be freely selected or use an internationally universal standard, and based on order m of h(x), a CRC algorithm is referred to as CRC-m, for example, CRC-32 or CRC-64.

The foregoing describes a possible first decision manner. In actual application, another decision manner may alternatively be used. For example, hash calculation is performed on the flow information by using an exclusive OR operation or a modulo operation. This is not specifically limited in this embodiment of the present invention.

After the first member link is determined in step 102, whether the first member link is currently available can be determined. In this embodiment of the present invention, "available" means being available both physically and in management. Specifically, "available physically" includes that a physical status of a link is normal and the link can be used to transmit data, and "available in management" includes that an administrator configures enabling of the link for participating in operating.

In addition, a member link in the first group of member links is available or unavailable. Generally, it may be preconfigured that all uplinks or downlinks of a network element are the first group of member links, and include available and unavailable links. For example, downlinks of the network element 1 include a link 1 to a link 4, where the link 4 is faulty, that is, unavailable, and the other three links are available links.

Optionally, the first group of member links may be stored in the network element in a form of a member link table, and meanwhile, the table may further record whether each link is in an available state. Accordingly, after the first member link is determined in step 102, whether the first member link is available may be determined by querying the table for a link status. For example, the first member link is the link 1, and it can be determined, by querying the table, that the link 1 is available. If the first member link is the link 4, it can be determined, by querying the table, that the link 4 is in an unavailable state.

Certainly, in actual application, an available or unavailable state of each link may alternatively be recorded in another manner. This is not specifically limited in this embodiment of the present invention.

Optionally, if the first member link is currently available, the packet may be sent through the first member link.

Optionally, if the first member link is unavailable, step 103 is performed, in other words, the second member link in the second group of member links is determined based on the second decision manner. All member links in the second group of member links are available links and are all available links in the first group of member links. For example, the second group of member links includes the link 1 to the link 3. In other words, links except unavailable links in the first group of member links are the second group of member links.

It should be noted that the second group of member links may change over time, and this change includes both a change of a link quantity and a change of a specific link. For example, over time, the link 4 is restored from a fault but the link 2 becomes faulty. In this case, the second group of member links change to the link 1, the link 3, and the link 4. For another example, the link 4 is still faulty, and the link 2 also becomes faulty. In this case, the second group of member links change to the link 1 and the link 3.

Similarly, a status of a link in the first group of member links may change over time. For example, when the link 4 is restored from a fault, a status of the link 4 is changed to an available state. For another example, the link 2 also becomes faulty. In this case, a status of the link 2 is changed to an unavailable state.

Step 103 may also have a plurality of implementations. A possible case is that: the second decision manner may be the same as the first decision manner. For example, the above-described CRC algorithm is also used. A same generator polynomial may be used, or a different generator polynomial may be used. Using different generator polynomials may avoid a polarization phenomenon. Another possible case is that: the second decision manner is different from the first decision manner. For example, the first decision manner uses the above-described CRC algorithm, and the second decision manner may use an exclusive OR operation or directly use a modulo operation.

Because the second group of member links is all available, the determined second member link is also available. Therefore, step 104 can be performed, in other words, the packet is sent through the second member link.

The following gives a specific example to describe an implementation process of the data transmission method in this embodiment of the present invention in comparison with a data transmission method in the prior art.

It is assumed that four links of a network element are all available at the beginning of a time period. In the prior art, link direction is performed based on the foregoing CRC algorithm. For a direction result, refer to Table 1.

TABLE 1

| | | No member link fails | | | |
|---|---|---|---|---|---|
| | | Total quantity | | Only a link 4 fails | |
| Flow identifier | CRC result | of member links | Link number | Total quantity of member links | Link number |
| 1 | 7 | 4 | 3 | 3 | 1 |
| 2 | 8 | 4 | | 3 | 2 |
| 3 | 23 | 4 | 3 | 3 | 2 |
| 4 | 17 | 4 | 1 | 3 | 2 |
| 5 | 22 | 4 | 2 | 3 | 1 |

TABLE 1-continued

| | | No member link fails | | Only a link 4 fails | |
|---|---|---|---|---|---|
| Flow identifier | CRC result | Total quantity of member links | Link number | Total quantity of member links | Link number |
| 6 | 31 | 4 | 3 | 3 | 1 |
| 7 | 0 | 4 | 0 | 3 | 0 |
| 8 | 25 | 4 | 1 | 3 | 1 |

In the prior art, a modulo operation is performed on a total quantity of available links based on a CRC result, no member link fails at the beginning, and therefore a total quantity of available member links is four. For modulo operations on total quantities of available member links for eight packet flows based on CRC results, refer to link numbers in the fourth column in Table 1. Link numbers 0-3 correspond to the link 1 to the link 4 respectively.

At a subsequent moment, the link 4 fails. According to the method in the prior art, because the total quantity of available links changes to 3, the CRC results modulo 3 are recalculated for all the packet flows. Calculation results are shown by link numbers in the sixth column in Table 1.

For a clearer comparison between a flow distribution status of each link before the link fails and that after the link fails, refer to Table 2 and Table 3. Table 2 indicates the flow distribution status of each link before the link fails, and Table 3 indicates the flow distribution status of each link after the link fails.

TABLE 2

| Link 1 | Link 2 | Link 3 | Link 4 |
|---|---|---|---|
| Flow 2 | Flow 4 | Flow 5 | Flow 1 |
| Flow 7 | Flow 8 | | Flow 3 |
| | | | Flow 6 |

TABLE 3

| Link 1 | Link 2 | Link 3 | Link 4 |
|---|---|---|---|
| Flow 7 | Flow 1 | Flow 2 | |
| | Flow 5 | Flow 3 | |
| | Flow 6 | Flow 4 | |
| | Flow 8 | | |

It can be learned from Table 2 and Table 3 that, before the link 4 fails, a packet of a flow 2 is forwarded from the link 1, and after the link 4 fails, a subsequent packet of the flow 2 is forwarded from the link 3. Before the link 4 fails, a packet of a flow 5 is forwarded from the link 3, and after the link 4 fails, a subsequent packet of the flow 5 is forwarded from the link 2. To be specific, after a link fails, a flow on another properly-functioning link before the link fails is redistributed. Similarly, when the link 4 is restored to an available state from a fault, flow distribution is restored again from a state in Table 3 to a state in Table 2, and a case in which a flow in a properly-functioning link is redistributed occurs again. Such a case is likely to affect a service. For example, congestion causes a packet loss, and convergence causes impact on session consistency.

If the transmission method in this embodiment of the present invention is used, when the link 4 fails, a calculation result is the same as a calculation result before the link 4 fails. This is because determining is performed in the first group of member links during a first decision, to be specific, a modulo operation is performed on a quantity of all available and unavailable member links based on a CRC result, for example, a CRC result modulo 4 is still calculated. However, if the calculation result is the failed link 4 during the first decision, recalculation is performed again in remaining available member links, to be specific, the CRC result modulo 3 is calculated to obtain a new calculation result. Referring to Table 4, Table 4 shows a comparison between a result of calculation by using the transmission method in this embodiment of the present invention after a link fails and a calculation result before the link fails.

TABLE 4

| | | No member link fails | | Only a link 4 fails | |
|---|---|---|---|---|---|
| Flow identifier | CRC result | Total quantity of member links | Link number | Total quantity of member links | Link number |
| 1 | 7 | 4 | 3 | 3 | 0 |
| 2 | 8 | 4 | 0 | 3 | 0 |
| 3 | 23 | 4 | 3 | 3 | 1 |
| 4 | 17 | 4 | 1 | 3 | 1 |
| 5 | 22 | 4 | 2 | 3 | 2 |
| 6 | 31 | 4 | 3 | 3 | 2 |
| 7 | 0 | 4 | 0 | 3 | 0 |
| 8 | 25 | 4 | 1 | 3 | 1 |

For example, as shown in Table 4, a first CRC calculation result is 7, the first CRC calculation result modulo 4 is calculated, and an obtained link number is 3, that is, the link 4. It is found, through determining, that the link 4 has failed. Therefore, a CRC result is recalculated, the CRC result modulo 3 is calculated, and an obtained link number is 0, that is, the link 1. A packet flow that is originally to be directed to the link 4 is redirected to the link 1. Similarly, another packet that is originally to be directed to the link 4 is redirected to another properly-functioning link through a second decision.

For such a flow 2 of which a CRC result is 8, forwarding from the link 1 is determined through the first decision. Because the link 1 is available, a further decision is not needed. Therefore, when the link 4 fails, a direction result is still the link 1, that is, the link number 0. Similarly, another flow distributed on another properly-functioning link before the link 4 fails is still distributed on the original link after the link 4 fails, and remains unchanged. For a clearer decision result, refer to Table 2 and Table 5. Table 5 shows a flow distribution status of each link after the link 4 fails.

TABLE 5

| Link 1 | Link 2 | Link 3 | Link 4 |
|---|---|---|---|
| Flow 2 | Flow 4 | Flow 5 | |
| Flow 7 | Flow 8 | Flow 6 | |
| Flow 1 | Flow 3 | | |

It can be learned from a comparison between Table 5 and Table 2 that, after the link 4 fails, a flow originally distributed on the link 4 is redistributed on another properly-functioning link. However, a flow distributed on a properly-functioning link before the link 4 fails is still distributed on the original link after the link 4 fails. Similarly, after the link 4 is restored from a failed state to an available state, only the link 4 returns to a state before the link 4 fails, that is, a state in Table 2. Redistribution of an original flow on another properly-functioning link is not caused.

It can be learned from the foregoing description that, according to the method in this embodiment of the present invention, an entire process in which a link fails or is restored from a failure does not affect distribution of a flow directed to another link during the first decision, and no service loss is caused.

Based on a same inventive concept, an embodiment of the present invention further provides a network element (as shown in FIG. 2). The network element is configured to implement any one of the foregoing methods.

Specifically, a processor 10 is configured to receive a packet through a receiver 30 or generate a packet and further configured to: determine a first member link in a first group of member links based on a first decision manner, and if the first member link is unavailable, determine a second member link in a second group of member links based on a second decision manner, where all member links in the second group of member links are available, the first group of member links includes the second group of member links and an unavailable member link, and the member link corresponds to a port 50; and a transmitter 20 is configured to send the packet through the port 50 corresponding to the second member link.

Optionally, the processor 10 is configured to: obtain flow information of the packet, where the flow information is used to describe the packet; perform hash calculation on the flow information; and determine the first member link in the first group of member links based on a hash value that is obtained through calculation.

Optionally, the processor 10 is configured to perform hash calculation on the flow information based on a first cyclic redundancy check CRC algorithm.

Optionally, the processor 10 is configured to: obtain the flow information, perform hash calculation on the flow information based on a second CRC algorithm that is different from the first CRC algorithm, and determine the second member link in the second group of member links based on a hash value that is obtained through calculation based on the second CRC algorithm.

Optionally, the processor 10 is configured to determine the first member link based on the hash value that is obtained through calculation and a total quantity of links in the first group of member links.

Based on a same inventive concept, an embodiment of the present invention further provides a data transmission apparatus. As shown in FIG. 5, the data transmission apparatus includes: an obtaining unit 201, configured to obtain a packet; a processing unit 202, configured to: determine a first member link in a first group of member links based on a first decision manner, and if the first member link is unavailable, determine a second member link in a second group of member links based on a second decision manner, where all member links in the second group of member links are available and the first group of member links includes the second group of member links and an unavailable member link; and a transmitting unit 203, configured to send the packet through the second member link.

Optionally, the processing unit 202 is configured to: obtain flow information of the packet, where the flow information is used to describe the packet; perform hash calculation on the flow information; and determine the first member link in the first group of member links based on a hash value that is obtained through calculation.

Optionally, the processing unit 202 is configured to perform hash calculation on the flow information based on a first cyclic redundancy check CRC algorithm.

Optionally, the processing unit 202 is configured to: obtain the flow information, perform hash calculation on the flow information based on a second CRC algorithm that is different from the first CRC algorithm, and determine the second member link in the second group of member links based on a hash value that is obtained through calculation based on the second CRC algorithm.

Optionally, the processing unit 202 is configured to determine the first member link based on the hash value that is obtained through calculation and a total quantity of links in the first group of member links.

Various variants and specific examples of the data transmission method in the foregoing embodiments are also applicable to the data transmission apparatus in this embodiment and the network element in FIG. 2. Through the foregoing detailed description of the data transmission method, a person skilled in the art may clearly understand implementations of the data transmission apparatus in this embodiment and the network element in FIG. 2. Therefore, for brevity of this specification, details are not described herein again.

Persons skilled in the art should understand that the embodiments of the present invention may be provided as a method, a system, or a computer program product. Therefore, the present invention may use a form of hardware only embodiments, software only embodiments, or embodiments with a combination of software and hardware. Moreover, the present invention may use a form of a computer program product that is implemented on one or more computer-usable storage media (including but not limited to a disk memory, an optical memory, and the like) that include computer-usable program code.

The present invention is described with reference to flowcharts and/or block diagrams of methods, devices (systems), and computer program products provided in the embodiments of the present invention. It should be understood that computer program instructions may be used to implement each process and/or each block in the flowcharts and/or the block diagrams and a combination of a process and/or a block in the flowcharts and/or the block diagrams. These computer program instructions may be provided for a general-purpose computer, a dedicated computer, an embedded processor, or a processor of any other programmable data processing device to generate a machine, so that the instructions executed by a computer or a processor of any other programmable data processing device generate an apparatus for implementing a specific function in one or more processes in the flowcharts and/or in one or more blocks in the block diagrams.

These computer program instructions may also be stored in a computer readable memory that can instruct the computer or any other programmable data processing device to work in a specific manner, so that the instructions stored in the computer readable memory generate an artifact that includes an instruction apparatus. The instruction apparatus implements a specific function in one or more processes in the flowcharts and/or in one or more blocks in the block diagrams.

These computer program instructions may also be loaded onto a computer or another programmable data processing device, so that a series of operations and steps are performed on the computer or the another programmable device, thereby generating computer-implemented processing. Therefore, the instructions executed on the computer or the another programmable device provide steps for implementing a specific function in one or more processes in the flowcharts and/or in one or more blocks in the block diagrams.

Obviously, persons skilled in the art can make various modifications and variations to the present invention without departing from the spirit and scope of the present invention. The present invention is intended to cover these modifications and variations provided that they fall within the scope of protection defined by the following claims and their equivalent technologies.

What is claimed is:

1. A data transmission method, comprising:
receiving a packet;
determining, from information in the packet, a first member link in a first group of member links based on a first decision manner with a first hash algorithm;
in response to determining that the first member link is unavailable, determining a second member link in a second group of member links based on a second decision manner with a second hash algorithm, wherein all member links in the second group of member links are available and the first group of member links comprises the second group of member links and an unavailable member link, wherein the second hash algorithm of the second decision manner is different from the first hash algorithm of the first decision manner; and
sending the packet through the second member link.

2. The method according to claim 1, wherein determining the first member link comprises:
obtaining flow information of the packet, wherein the flow information is used to describe the packet;
performing hash calculation on the flow information; and
determining the first member link in the first group of member links based on a hash value that is obtained through the hash calculation.

3. The method according to claim 2, wherein performing the hash calculation comprises:
performing the hash calculation on the flow information based on a first cyclic redundancy check (CRC) algorithm.

4. The method according to claim 3, wherein determining the second member link comprises:
obtaining the flow information;
performing the hash calculation on the flow information based on a second CRC algorithm that is different from the first CRC algorithm; and
determining the second member link in the second group of member links based on a hash value that is obtained through the hash calculation based on the second CRC algorithm.

5. The method according to claim 2, wherein determining the first member link in the first group of member links based on the hash value that is obtained through the hash calculation comprises:
determining the first member link based on the hash value that is obtained through calculation and a total quantity of links in the first group of member links.

6. A network element, comprising:
a receiver;
a port;
a memory storing instructions;
a processor in communication with the memory, wherein the processor is configured to execute the instructions to:
receive a packet through the receiver or generate the packet,
determine, from information in the packet, a first member link in a first group of member links based on a first decision manner with a first hash algorithm, and
in response to determining that the first member link is unavailable, determine a second member link in a second group of member links based on a second decision manner with a second hash algorithm, wherein all member links in the second group of member links are available, the first group of member links comprises the second group of member links and an unavailable member link, and the second member link corresponds to the port, wherein the second hash algorithm of the second decision manner is different from the first hash algorithm of the first decision manner; and
a transmitter, configured to send the packet through the port corresponding to the second member link.

7. The network element according to claim 6, wherein the processor is configured to execute the instructions to: obtain flow information of the packet, wherein the flow information is used to describe the packet; perform hash calculation on the flow information; and determine the first member link in the first group of member links based on a hash value that is obtained through the hash calculation.

8. The network element according to claim 7, wherein the processor is configured to execute the instructions to perform hash calculation on the flow information based on a first cyclic redundancy check (CRC) algorithm.

9. The network element according to claim 8, wherein the processor is configured to execute the instructions to: obtain the flow information, perform the hash calculation on the flow information based on a second CRC algorithm that is different from the first CRC algorithm, and determine the second member link in the second group of member links based on a hash value that is obtained through the hash calculation based on the second CRC algorithm.

10. The network element according to claim 7, wherein the processor is configured to execute the instructions to determine the first member link based on the hash value that is obtained through the hash calculation and a total quantity of links in the first group of member links.

11. A data transmission apparatus, comprising:
a receiver configured to obtain a packet;
a memory storing instructions;
a processor in communication with the memory, wherein the processor is configured to execute the instructions to:
determine, from information in the packet, a first member link in a first group of member links based on a first decision manner with a first hash algorithm,
in response to determining that the first member link is unavailable, determine a second member link in a second group of member links based on a second decision manner with a second hash algorithm, wherein all member links in the second group of member links are available and the first group of member links comprises the second group of member links and an unavailable member link, wherein the second hash algorithm of the second decision manner is different from the first hash algorithm of the first decision manner; and
a transmitter configured to send the packet through the second member link.

12. The apparatus according to claim 11, wherein the processor is configured to execute the instructions to: obtain flow information of the packet, wherein the flow information is used to describe the packet; perform hash calculation on the flow information; and determine the first member link in the first group of member links based on a hash value that is obtained through the hash calculation.

13. The apparatus according to claim 12, wherein the processor is configured to execute the instructions to perform the hash calculation on the flow information based on a first cyclic redundancy check (CRC) algorithm.

14. The apparatus according to claim 13, wherein the processor is configured to execute the instructions to: obtain the flow information, perform the hash calculation on the flow information based on a second CRC algorithm that is different from the first CRC algorithm, and determine the second member link in the second group of member links based on a hash value that is obtained through the hash calculation based on the second CRC algorithm.

15. The apparatus according to claim 12, wherein the processor is configured to execute the instructions to determine the first member link based on the hash value that is obtained through the hash calculation and a total quantity of links in the first group of member links.

* * * * *